(12) United States Patent
Nakatani

(10) Patent No.: US 11,199,480 B2
(45) Date of Patent: Dec. 14, 2021

(54) THIN-SAMPLE-PIECE FABRICATING DEVICE AND THIN-SAMPLE-PIECE FABRICATING METHOD

(71) Applicant: HITACHI HIGH-TECH SCIENCE CORPORATION, Tokyo (JP)

(72) Inventor: Ikuko Nakatani, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/646,911

(22) PCT Filed: Feb. 28, 2019

(86) PCT No.: PCT/JP2019/007852
§ 371 (c)(1),
(2) Date: Mar. 12, 2020

(87) PCT Pub. No.: WO2019/168106
PCT Pub. Date: Sep. 6, 2019

(65) Prior Publication Data
US 2020/0300736 A1      Sep. 24, 2020

(30) Foreign Application Priority Data
Feb. 28, 2018  (JP) .............................. JP2018-034520

(51) Int. Cl.
*G01N 1/32*       (2006.01)
*H01J 37/317*   (2006.01)

(52) U.S. Cl.
CPC ............ *G01N 1/32* (2013.01); *H01J 37/3174* (2013.01)

(58) Field of Classification Search
CPC ................. G01N 1/32; H01J 37/3174
See application file for complete search history.

(56) References Cited

U.S. PATENT DOCUMENTS

2012/0298884 A1   11/2012   Nakajima et al.
2013/0209700 A1    8/2013   Suzuki et al.
(Continued)

FOREIGN PATENT DOCUMENTS

JP      H03-036285 A     2/1991
JP      2009-036574 A    2/2009
(Continued)

OTHER PUBLICATIONS

International Search Report, including English translation, and Written Opinion, of Application No. PCT/JP2019/007852, dated May 28, 2019, 9 pages.

*Primary Examiner* — Nicole M Ippolito
*Assistant Examiner* — Hanway Chang
(74) *Attorney, Agent, or Firm* — Crowell & Moring LLP

(57) ABSTRACT

A thin-sample-piece fabricating device is provided with a focused-ion-beam irradiation optical system, a stage, a stage driving mechanism, and a computer. The focused-ion-beam irradiation optical system performs irradiation with a focused ion beam (FIB). The stage holds a sample piece (Q). The stage driving mechanism drives the stage. The computer sets a thin-piece forming region serving as a treatment region, as well as a peripheral section surrounding the entire periphery of the thin-piece forming region, on the sample piece (Q). The computer causes irradiation with the focused ion beam (FIB) from a direction crossing the irradiated face of the sample piece (Q) so as to perform etching treatment such that the thickness of the thin-piece forming region becomes less than the thickness of the peripheral section.

10 Claims, 6 Drawing Sheets

(56) References Cited

U.S. PATENT DOCUMENTS

| | | |
|---|---|---|
| 2013/0241091 A1 | 9/2013 | Man |
| 2014/0061159 A1 | 3/2014 | Asahata et al. |
| 2015/0255248 A1 | 9/2015 | Boguslavsky et al. |

FOREIGN PATENT DOCUMENTS

| | | |
|---|---|---|
| JP | 2013-164346 A | 8/2013 |
| JP | 2013-217898 A | 10/2013 |
| JP | 2014-063726 A | 4/2014 |
| WO | WO 2011-093316 A | 8/2011 | and method for fabricating a thin sample by etching treatment
THIN-SAMPLE-PIECE FABRICATING DEVICE AND THIN-SAMPLE-PIECE FABRICATING METHOD This application is a 371 application of PCT/W2019/007852 having an international filing date of Feb. 28, 2019, which claims priority to W2018-034520 filed Feb. 28, 2018, the entire content of each of which is incorporated herein by reference.

TECHNICAL FIELD

The present invention relates to an apparatus and a method for fabricating a thin sample by etching treatment using a particle beam.

BACKGROUND ART

In a defect analysis of a semiconductor device, there has been proposed a method of fabricating a thin sample having a shape suitable for various processes such as observation, analysis, and measurement with a transmission electron microscope (see, for example, PTL 1). In this sample fabricating method, an end part of a plate-like sample is irradiated with an ion beam from a direction orthogonal to a thickness direction of the sample, so as to perform etching treatment to notch the sample from the end part toward a central part of the sample. As a result, a thin film part, which thickness is reduced by one stage from the end part to the central part of the sample, is formed. The thin film part is supported by a part other than the thin film part, whiCh is thicker than the thin film part, thereby preventing a decrease in a support strength.

CITATION LIST

Patent Literature

PTL 1: JP-A-2013-164346

SUMMARY OF INVENTION

Technical Problem

According to the related-art sample fabricating method, since the etching treatment is performed from the end part toward the central part of the sample with respect to an observation region of the central part of the sample, the thin film part is also formed in a region other than the observation region, that is, in a region from the end part toward the central part. A size of the thin film part other than the observation region increases as the observation region is enlarged. If the thin film part other than the observation region is enlarged, a strength of the thin film part of the observation region may be decreased.

The present invention has been made in view of the above circumstances, and an object of the present invention is to provide a thin-sample-piece fabricating apparatus and a thin-sample-piece fabricating method capable of preventing decrease in a strength of a thin sample.

Solution to Problem

In order to solve the above problems and to achieve accompanying objects, the present invention adopts the following aspects.

(1) A thin-sample-piece fabricating apparatus according to a first aspect of the present invention is a thin-sample-piece fabricating apparatus configured to fabricate a thin sample by etching a sample via sputtering, the thin-sample-piece fabricating apparatus comprising: a particle-beam irradiation optical system configured to radiate a particle beam; a sample stage configured to hold the sample; a driving mechanism configured to drive the sample stage; and a computer configured to: define a treatment region of the sample in an image obtained by irradiating the sample with the particle beam; and control the particle-beam irradiation optical system and the driving mechanism so as to irradiate the treatment region with the particle beam to etch the sample, wherein the computer is configured to: set on the sample a thin-piece forming region as the treatment region and a peripheral part surrounding an entire periphery of the thin-piece forming region; and radiate the particle beam from a direction intersecting an irradiated face of the sample, so as to perform etching treatment to form a thickness of the thin-piece forming region to be thinner than a thickness of the peripheral part.

(2) In the thin-sample-piece fabricating apparatus according to the above (1), the computer may be configured to: receive an input related to an angle between the irradiated face and an irradiation axis of the particle beam and the thin-piece forming region; set the thin-piece forming region on the sample based on the input; control the driving mechanism based on the input so as to set the angle between the irradiated face and the irradiation axis to a predetermined angle; and control the particle beam irradiating optical system and the driving mechanism to perform the etching treatment by scanning the thin-piece forming region with the particle beam while maintaining the predetermined angle.

(3) In the thin-sample-piece fabricating apparatus according to the above (2), the computer may be configured to: receive an input related to a relative rotation angle of the irradiation axis around a normal line of the irradiated face; and control the particle-beam irradiation optical system and the driving mechanism to relatively rotate the irradiation axis around a normal line including a center of the thin-piece forming region among normal lines of the irradiated face in a predetermined range of rotation angle, while maintaining the predetermined angle based on the input.

(4) A thin-sample-piece fabricating method according to another aspect of the present invention is thin-sample-piece fabricating method comprising: a setting step of setting on a sample a thin-piece forming region and a peripheral part surrounding an entire periphery of the thin-piece forming region; and a treatment step of radiating a particle beam from a direction intersecting an irradiated face of the sample, so as to perform etching treatment via sputtering to form a thickness of the thin-piece forming region to be thinner than a thickness of the peripheral part.

(5) In the thin-sample-piece fabricating method according to the above (4), in the setting step, an outer shape of the thin-piece forming region may be set to a circular shape when viewed from a normal direction of the irradiated face.

(6) In the thin-sample-piece fabricating method according to the above (5), in the treatment step, the irradiation axis may be relatively rotated around a normal line including a center of the thin-piece forming region within among normal lines of the irradiated face, while maintaining a constant angle between the irradiated face and an irradiation axis of the particle beam.

Advantageous Effects of Invention

According to the thin-sample-piece fabricating apparatus and the thin-sample-piece fabricating method of the present invention, since the peripheral part surrounding the entire periphery of the thin-piece forming region of the sample is provided, for example, the support strength of the thin-piece forming region can be increased as compared with a case where at least a part of a peripheral edge of the thin-piece forming region is not supported by a part formed thicker than the thin-piece forming region. Further, by radiating the particle beam from the direction intersecting the irradiated face of the sample, the etching treatment can be advanced in parallel to the irradiated face at a desired depth from the irradiated face in the thickness direction of the sample.

DESCRIPTION OF EMBODIMENTS

A thin-sample-piece fabricating apparatus and a thin-sample-piece fabricating method according to an embodiment of the present invention will be described below with reference to the drawings.

Figure 1:
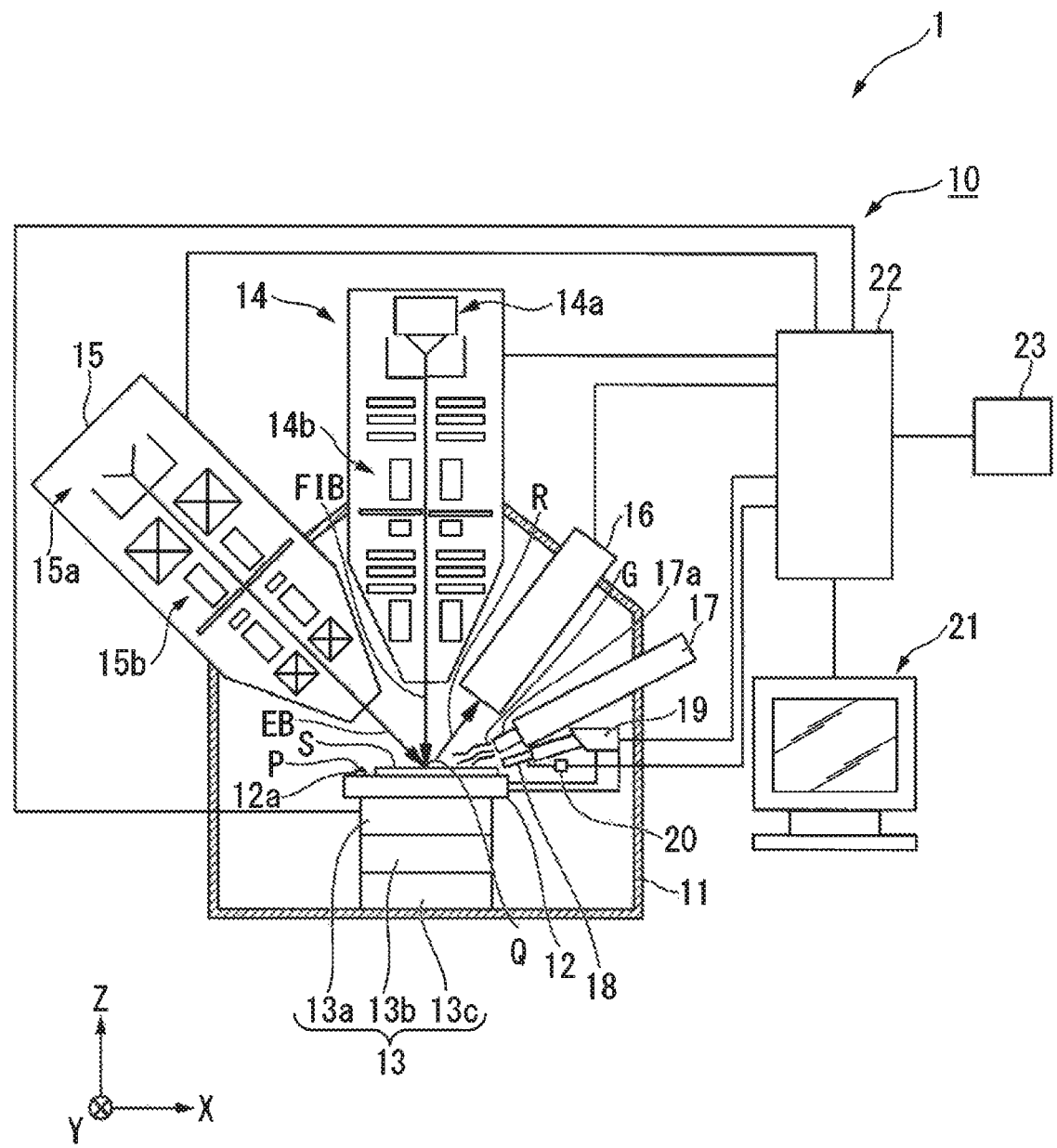
FIG. 1 is a configuration diagram of a charged particle beam device as an example of a thin-sample-piece fabricating apparatus according to an embodiment of the present invention.

FIG. 1 is a configuration diagram of the thin-sample-piece fabricating apparatus according to the embodiment of the present invention.

A thin-sample-piece fabricating apparatus 1 according to the embodiment of the present invention is, for example, a charged particle beam device 10. As shown in FIG. 1, the charged particle beam device 10 includes a sample chamber 11 capable of maintaining an inside thereof in a vacuum state, a stage 12 configured to fix a sample S and a sample piece holder P inside the sample chamber 11, and a stage driving mechanism 13 configured to drive the stage 12. The charged particle beam device 10 includes a focused-ion-beam irradiation optical system 14 configured to irradiate an irradiation target within a predetermined irradiation region (that is, a scanning range) inside the sample chamber 11 with a focused ion beam (FIB). The charged particle beam device 10 includes an electron-beam irradiation optical system 15 configured to irradiate an irradiation target within a predetermined irradiation region inside the sample chamber 11 with an electron beam (EB). The charged particle beam device 10 includes a detector 16 configured to detect secondary charged particles (secondary electrons, secondary ions) R generated from the irradiation target via irradiation of the focused ion beam or the electron beam. The charged particle beam device 10 includes a gas supply unit 17 configured to supply a gas G to a face of the irradiation target. Specifically, the gas supply unit 17 includes a nozzle having an outer diameter of about 200 µm. The charged particle beam device 10 includes: a needle 18 configured to take out a minute sample piece Q from the sample S fixed to the stage 12 and to hold the sample piece Q and transfer the sample piece Q to the sample piece holder P; a needle driving mechanism 19 configured to drive the needle 18 to transport the sample piece Q; and an absorption current detector 20 configured to detect an inflow current (also referred to as an absorption current) of the charged particle beam flowing into the needle 18 and to send an inflow current signal to a computer to image the same. The charged particle beam device 10 includes: a display device 21 configured to display image data based on the secondary charged particles R detected by the detector 16; a computer 22; and an input device 23.

The charged particle beam device 10 according to this embodiment is configured to irradiate the face of the irradiation target while scanning the focused ion beam, so as to perform various processes (excavation, trimming, etc.) by imaging or sputtering of the irradiated part and formation of a deposition film. The charged particle beam device 10 is configured to perform processing of forming, from the sample S, a sample piece Q (for example, a thin sample or a needle sample) for transmission observation using a transmission electron microscope or a sample piece for analysis using electron beam. The charged particle beam device 10 is configured to process the sample piece Q transferred to the sample piece holder P into a thin sample having a desired thickness suitable for transmission observation by a transmission electron microscope (for example, 5 to 100 nm). The charged particle beam device 10 is configured to perform observation of a face of an irradiation target such as the sample piece Q and the needle 18 by irradiating the face of the irradiation target while scanning the face with the focused ion beam or the electron beam.

The absorption current detector 20 includes a preamplifier. The absorption current detector 20 amplifies the inflow current of the needle 18 and sends the amplified inflow current to the computer 22. Due to a signal obtained by synchronizing the needle inflow current detected by the absorption current detector 20 and the scanning of the charged particle beam with each other, an absorption current image of a needle shape can be displayed on the display device 21, so that the needle shape and a tip position can be specified.

The sample chamber 11 can be evacuated to a desired vacuum state of the inside thereof by an exhaust device (not shown) and can maintain the desired vacuum state.

The stage 12 holds the sample S. The stage 12 includes a holder fixing base 12a configured to hold the sample piece holder P. The holder fixing base 12a may have a structure that have a plurality of sample piece holders P mounted thereon.

The stage driving mechanism 13 is accommodated inside the sample chamber 11 in a state connected to the stage 12. The stage driving mechanism 13 is configured to displace the stage 12 with respect to a predetermined axis based on a control signal output from the computer 22. For example, the stage driving mechanism 13 is a five-axis driving mechanism. The five-axis driving mechanism includes a moving mechanism 13a configured to move the stage 12 at least along an X axis and a Y axis that are parallel to a horizontal plane and parallel to each other, and along a Z axis in a vertical direction orthogonal to the X axis and the Y axis. The five-axis driving mechanism includes a tilting mechanism 13b configured to tilt the stage 12 around the X axis or the Y axis, and a rotation mechanism 13c configured to rotate the stage 12 around the Z axis.

The focused-ion-beam irradiation optical system 14 is fixed to the sample chamber 11 such that a beam emission unit (not shown) inside the sample chamber 11 faces the stage 12 at a position vertically above the stage 12 in the irradiation region, and such that an optical axis thereof is parallel to the vertical direction. As a result, irradiation targets such as the sample S and the sample piece Q placed on the stage 12, and the needle 18 present in the irradiation region can be irradiated with the focused ion beam downward from above in the vertical direction. The charged particle beam device 10 may include another ion beam irradiation optical system, instead of the above-described focused-ion-beam irradiation optical system 14, The ion beam irradiation optical system is not limited to the above-described optical system that forms the focused beam. The ion beam irradiation optical system may be, for example, a projection type ion beam irradiation optical system in which a stencil mask having a standard opening is installed in the optical system so as to form a shaped beam of an opening shape of the stencil mask. According to such a projection type ion beam irradiation optical system, a shaped beam having a shape corresponding to the treatment region around the sample piece Q can be formed with high accuracy, and a treatment time can be shortened.

The focused-ion-beam irradiation optical system 14 includes an ion source 14a configured to generate ions and an ion optical system 14b configured to focus and deflect the ions extracted from the ion source 14a. The ion source 14a and the ion optical system 14b are controlled based on a control signal output from the computer 22, and an irradiation position, an irradiation condition and the like of the focused ion beam are controlled by the computer 22. The ion source 14a is, for example, a liquid metal ion source using liquid gallium or the like, a plasma ion source, a gas field ion source, or the like. The ion optical system 14b includes, for example, a first electrostatic lens such as a condenser lens, an electrostatic deflector, a second electrostatic lens such as an objective lens, and the like. In a case a plasma ion source is used as the ion source 14a, high-speed treatment by a large current beam can be realized, which is suitable for extraction of a large sample S.

The electron-beam irradiation optical system 15 is fixed to the sample chamber 11 such that the beam emission unit (not shown) inside the sample chamber 11 is caused to face the stage 12 in a tilt direction tilt at a predetermined angle (for example, 60°) with respect to the vertical direction of the stage 12 in the irradiation region, and such that an optical axis thereof is parallel to the tilt direction. As a result, irradiation targets such as the sample S and the sample piece Q fixed on the stage 12, and the needle 18 present in the irradiation region can be irradiated with the electron beam downward from above in the tilt direction.

The electron-beam irradiation optical system 15 includes: an electron source 15a configured to generate electrons; and an electron optical system 15b configured to focus and deflect the electrons extracted from the electron source 15a. The electron source 15a and the electron optical system 15b are controlled based on a control signal output from the computer 22, and an irradiation position, an irradiation condition and the like of the electron beam are controlled by the computer 22. The electron optical system 15 b includes, for example, an electromagnetic lens, a deflector, and the like.

Incidentally, the arrangement of the electron-beam irradiation optical system 15 and the focused-ion-beam irradiation optical system 14 may be replaced such that, the electron-beam irradiation optical system 15 may be arranged in the vertical direction, and the focused-ion-beam irradiation optical system 14 may be arranged in a tilt direction tilt by a predetermined angle with respect to the vertical direction.

The detector 16 is configured to detect an intensity of the secondary charged particles (secondary electrons and secondary ions) R (that is, an amount of secondary charged particles) emitted from the irradiation target when the focused ion beam or the electron beam is applied to the irradiation target, such as the sample S and the needle 18, and to output information on the detection amount of the secondary charged particles R. The detector 16 is disposed at a position capable of detecting the amount of the secondary charged particles R inside the sample chamber 11, for example, at a position obliquely above the irradiation target such as the sample S in the irradiation region, and is fixed to the sample chamber 11.

The gas supply unit 17 is fixed to the sample chamber 11. The gas supply unit 17 includes a gas injection unit 17a (for example, a nozzle) inside the sample chamber 11. The gas injection unit 17a is disposed to face the stage 12. The gas supply unit 17 is configured to supply, to the sample S, an etching gas for selectively accelerating the etching treatment of the sample S by the focused ion beam depending on a material of the sample S, a deposition gas for forming a deposition film formed of a deposit such as a metal or an insulator on the face of the sample S, or the like. For example, an etching gas such as xenon fluoride for a silicon-based sample S and water for an organic sample S is supplied to the sample S together with the irradiation of the focused ion beam, thereby accelerating the etching in a material-selective manner. Further, for example, a deposition gas containing platinum, carbon, tungsten, or the like is supplied to the sample S together with the irradiation of the focused ion beam, thereby depositing a solid component decomposed from the deposition gas on the face of the sample S. Specific examples of the deposition gas include, a gas containing carbon such as phenanthrene, naphthalene, and pyrene, a gas containing platinum such as trimethyl (methylcyclopentadienyl) platinum, and a gas containing tungsten such as tungsten hexacarbonyl. In addition, depending on the supplied gas, it is also possible to perform etching or deposition by irradiating an electron beam.

The needle driving mechanism 19 is accommodated inside the sample chamber 11 in a state connected to the needle 18. The needle driving mechanism 19 is configured to displace the needle 18 based on a control signal output from the computer 22. The needle driving mechanism 19 is provided integrally with the stage 12, and moves integrally with the stage 12, for example, when the stage 12 rotates about a tilt axis (i.e., the X axis or the Y axis) by the tilt mechanism 13b. The needle driving mechanism 19 includes a movement mechanism (not shown) configured to move the needle 18 in parallel along each of the three-dimensional coordinate axes, and a rotation mechanism (not shown)

configured to rotate the needle 18 around a central axis of the needle 18. The three-dimensional coordinate axes is an orthogonal three-axis coordinate system that is independent from the orthogonal three-axis coordinate system of the sample stage and includes two dimensional coordinate axes parallel to the face of the stage 12. When the face of the stage 12 is in a tilt state or a rotation state, the coordinate system is tilt or rotated.

The computer 22 is configured to control at least the stage driving mechanism 13, the focused-ion-beam irradiation optical system 14, the electron-beam irradiation optical system 15, the gas supply unit 17, and the needle driving mechanism 19.

The computer 22 is disposed outside the sample chamber 11. The computer 22 is connected to a display device 21 and an input device 23 such as a mouse and a keyboard for outputting a signal according to an input operation by an operator.

The computer 22 is configured to integrally control operation of the charged particle beam device 10 based on a signal output from the input device 23 or a signal generated by a preset automatic operation control process.

The computer 22 is configured to convert the detection amount of the secondary charged particles R detected by the detector 16 while scanning the irradiation position of the charged particle beam into a luminance signal corresponding to the irradiation position, and generate image data indicating the shape of the irradiation target by a two-dimensional position distribution of the detected amount of the secondary charged particles R. In an absorption current image mode, the computer 22 detects the absorption current flowing through the needle 18 while scanning the irradiation position of the charged particle beam, thereby generating absorption current image data indicating the shape of the needle 18 by a two-dimensional position distribution of the absorption current (absorption current image). The computer 22 is configured to cause the display device 21 to display a screen for performing operations such as enlargement, shrinkage, movement, and rotation of each image data together with the generated image data. The computer 22 is configured to cause the display device 21 to display a screen for performing various settings such as mode selection and treatment setting in automatic sequence control.

The charged particle beam device 10 according to the embodiment of the present invention has the above configuration, and a method for fabricating a thin sample T for transmission observation with a transmission electron microscope using the charged particle beam device 10 will be described in the following.

Hereinafter, as an example of fabricating the thin sample performed by the computer 22, an operation of fabricating the thin sample T from the sample piece Q formed via treatment of the sample S by the focused ion beam FIB will be roughly divided into an initial setting step and a treatment step, which will be described sequentially.

Prior to an operation of fabricating the thin sample shown below, the sample piece Q to be processed is taken out from the sample S by the needle 18 and is transferred to the sample piece holder P. Through this transfer, the position and shape of the sample piece Q are obtained, and the stage 12 is driven by the stage driving mechanism 13 so that the sample piece Q enters an observation field region by the charged particle beam. For example, the position and the shape of the sample piece Q are obtained based on a known relative positional relationship between a reference mark provided on the sample S and the sample piece Q, and template matching based on a template obtained directly from the image data of the sample piece Q.

<Initial Setting Step>

First, the computer 22 receives an input of the operator related to treatment conditions of the sample piece Q, and performs initial setting of the treatment conditions in accordance with the input of the operator (step S01). For example, the treatment conditions include the position and the shape of the thin-piece forming region 31 in the sample piece Q, and a tilt angle $\theta a$ and a rotation angle $\theta b$ of an irradiation axis U of the focused ion beam FIB with respect to the sample piece Q.

Figure 2:
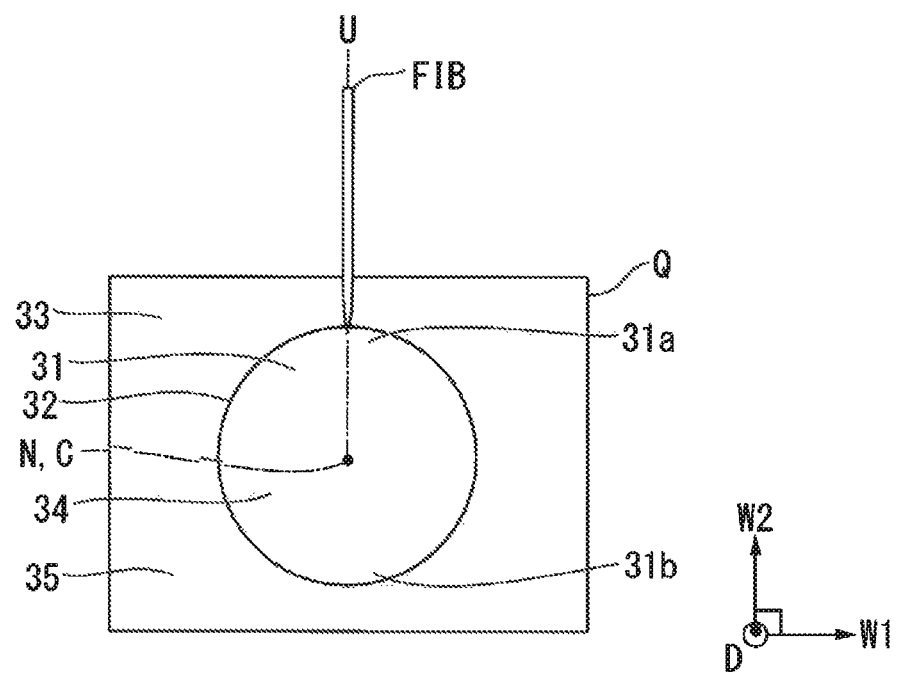
FIG. 2 is a plan view of an irradiated face of a sample piece in a thin-sample-piece fabricating method according to the embodiment of the present invention viewed from a normal direction (thickness direction).

FIG. 2 is a plan view of an irradiated face 34 of the sample piece Q in the thin-sample-piece fabricating method according to the embodiment of the present invention as viewed from the normal direction (a thickness direction D). For example, an outer shape of the sample piece Q is formed into a rectangular plate shape. A length of the sample piece Q in a first width direction W1 and a length of the sample piece Q in a second width direction W2 that is orthogonal to the thickness direction D and the first width direction W1 are about several tens of lam, for example.

The position and the shape of the thin-piece forming region 31 are specified via a treatment frame 32, which is input by the operator, on the image data obtained via the irradiation of the charged particle beam, for example. The treatment frame 32 is restricted so as to be set at a part surrounded by a peripheral part 33 of the sample piece Q. That is, the sample piece Q is divided by the treatment frame 32 into a thin-piece forming region 31 and the peripheral part 33 that surrounds an entire periphery of the thin-piece forming region 31. For example, an outer shape of the treatment frame 32 indicating the thin-piece forming region 31 is set to a circular shape having a diameter of about ten to twenty μm when viewed from the thickness direction D of the sample piece Q, that is, a normal direction of the irradiated face 34 of the sample piece Q, and an outer shape of the peripheral part 33 is set to an annular shape.

The tilt angle $\theta a$ (see FIG. 3) is an angle (intersection angle) between a face 35 including the irradiated face 34 of the sample piece Q and the irradiation axis U of the focused ion beam FIB. For example, the tilt angle $\theta a$ is set to a predetermined angle of an acute angle, which achieves thinning parallel to the irradiated face 34 of the sample piece Q in the treatment step to be performed later, and which prevents generation of a treatment stripe pattern generated in the irradiation direction of the focused ion beam FIB due to a curtain effect. The tilt angle $\theta s$ is set to several degrees to about 20°.

The curtain effect is a phenomenon that unevenness is formed on a treatment face due to a change in an etching rate due to a local difference in a shape or structure of a treatment target when the target to be processed is subject to etching treatment via irradiation of the focused ion beam FIB. An outer shape of the unevenness formed on the treatment face is, for example, formed in a stripe shape extending along the irradiation direction of the focused ion beam FIB. The unevenness formed on the treatment face due to the curtain effect may cause a treatment stripe pattern in an observation image of the treatment face, and may not be distinguished from a pattern caused by a structure or a defect originally included in the treatment target, which may result in erroneous interpretation.

The rotation angle $\theta b$ (see FIG. 4) is a relative rotation angle of the irradiation axis U of the focused ion beam FIB around a normal line N including a center C of the thin-piece forming region 31 among normal lines of the irradiated face 34 of the sample piece Q. For example, the rotation angle θb is set to a range of a predetermined rotation angle for removing the treatment stripe pattern generated due to the curtain effect in the treatment step to be performed later via etching of the focused ion beam FIB, which is about ±45° with respect to the irradiation axis U of the focused ion beam FIB.

The computer 22 drives the stage 12 with the stage driving mechanism 13 so that a posture of the sample piece Q with respect to the irradiation axis U of the focused ion beam FIB is in a predetermined posture according to an input of the operator. The computer 22 drives the stage 12 so as to tilt the irradiation axis U relative to the face 35 of the sample piece Q from a state where the face 35 and the irradiation axis U of the focused ion beam FIB are parallel to each other, such that an angle between the irradiated face 34 of the sample piece Q in the treatment frame 32 and the irradiation axis U of the focused ion beam FIB (the tilt angle θa) becomes a predetermined angle.

As a result, the computer 22 secures a posture of the sample piece Q suitable for the treatment step to be performed later, and also reduces an influence of the curtain effect generated when the sample piece Q is processed.

<Treatment Step>

Figure 3:
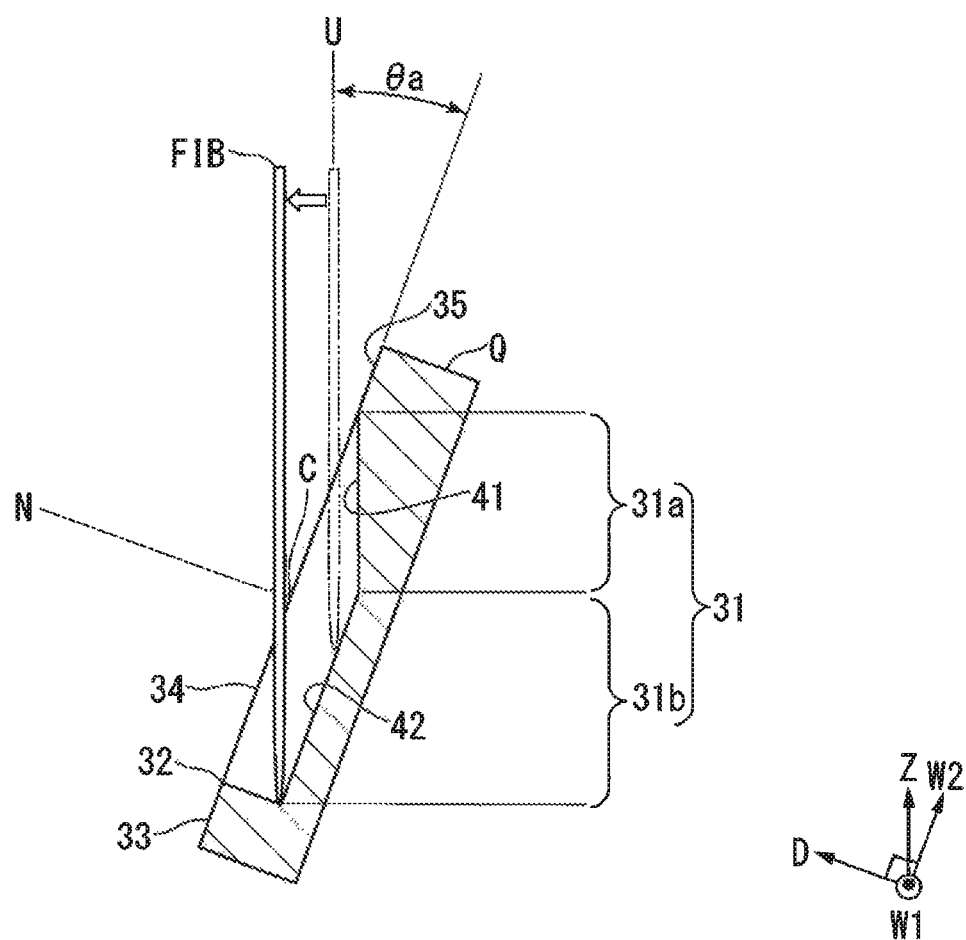
FIG. 3 is a cross-sectional view of a thin-piece forming region of the sample piece at a time of performing a treatment step of the thin-sample-piece fabricating method according to the embodiment of the present invention.

FIG. 3 is a cross-sectional view of the thin-piece forming region 31 of the sample piece Q at the time of performing the treatment step of the thin-sample-piece fabricating method according to the embodiment of the present invention.

Next, the computer 22 executes the treatment step (step S02). In the treatment step, the computer 22 controls the focused-ion-beam irradiation optical system 14 and the stage driving mechanism 13 so as to scan the thin-piece forming region in the treatment frame 32 with the focused ion beam FIB, while maintaining the angle between the irradiated face 34 in the treatment frame 32 of the sample piece Q and the irradiation axis U of the focused ion beam FIB (the tilt angle θa) at the predetermined angle.

Thus, in the thin-piece forming region 31, in an upstream part 31a in an incident direction of the focused ion beam FIB, a first cross section 41, which is parallel to the irradiation axis U of the focused ion beam FIB, is formed at a predetermined depth in the thickness direction from the irradiated face 34 of the sample piece Q. In the thin-piece forming region 31, in a downstream part 31b in the incident direction of the focused ion beam FIB, a second cross section 42 parallel to the irradiated face 34 is formed at a predetermined depth in the thickness direction of the sample piece Q.

As a result, the computer 22 forms the thickness of the thin-piece forming region 31 in the treatment frame 32 to be thinner than the thickness of the peripheral part 33 that surrounds the thin-piece forming region 31. For example, the thickness of the peripheral part 33 is about 1 to 2 μm, and the thickness of the thin-piece forming region 31 is about several tens of nm.

Figure 4:
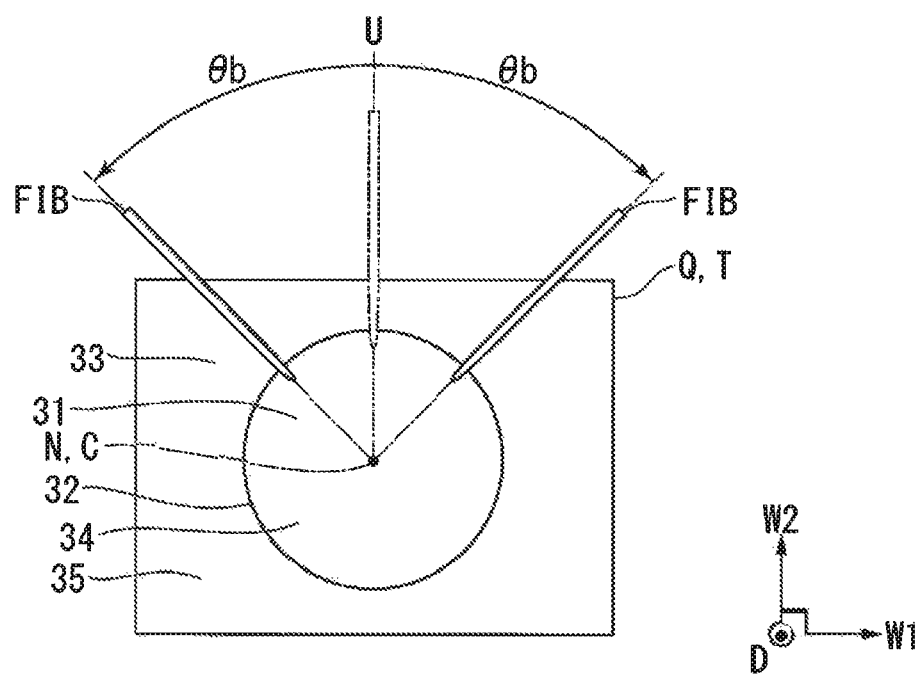
FIG. 4 is a view showing an example of relative positions of a focused ion beam and the sample piece at the time of performing the treatment step of the thin-sample-piece fabricating method according to the embodiment of the present invention, and is a plan view of the irradiated face of the sample piece viewed from the normal direction (thickness direction).

FIG. 4 is a view showing an example of relative positions of the focused ion beam FIB and the sample piece Q at the time of performing the treatment step of the thin-sample-piece fabricating method according to the embodiment of the present invention, and is a plan view of the irradiated face 34 of the sample piece Q viewed from the normal direction (thickness direction D).

For example, in the treatment step, the computer 22 controls the stage driving mechanism 13 so as to relatively rotate the irradiation axis U around the normal line N including the center C of the thin-piece forming region 31 among the normal lines of the irradiated face 34 in the range of the predetermined rotation angle, while maintaining the angle between the face 35 including the irradiated face 34 of the sample piece Q and the irradiation axis U of the focused ion beam FIB (the tilt angle θa) at the predetermined angle. For each predetermined rotation angle of the irradiation axis U around the normal line N of the irradiated face 34, the computer 22 controls the focused-ion-beam irradiation optical system 14 and the stage driving mechanism 13 so as to scan the thin-piece forming region 31 in the treatment frame 32 with the focused ion beam FIB, while maintaining the angle between the irradiated face 34 in the treatment frame 32 and the irradiation axis U at the predetermined angle.

As a result, the computer 22 removes the treatment stripe pattern generated due to the curtain effect in a state where the rotation angle of the irradiation axis U is at an appropriate constant angle by etching treatment with the focused ion beam FIB in an incident direction different from the appropriate constant angle. Still further, the computer 22 can etch at least a part of the upstream part 31a of the thin-piece forming region 31 formed in a state where the rotation angle of the irradiation axis U is at an appropriate constant angle with a focused ion beam FIB in an incident direction different from the appropriate constant angle, so as to form a treatment cross section, which is parallel to the irradiated face 34 similar as the second cross section 42 of the downstream part 31b, on at least a part of the upstream part 31a.

As described above, the computer 22 fabricates the thin sample T from the sample piece Q, and the series of operations of the thin-sample-piece fabricating method is ended.

As described above, according to the thin-sample-piece fabricating apparatus 1 and the thin-sample-piece fabricating method of the embodiment of the present invention, since the peripheral part 33 surrounding the entire periphery of the thin-piece forming region 31 of the sample piece Q is provided, for example, the support strength of the thin-piece forming region 31 can be increased as compared with a case where at least a part of the peripheral edge of the thin-piece forming region 31 is not supported by a part formed thicker than the thin-piece forming region. As a result, even though the thin-piece forming region 31 is increased, a desired strength at the time of etching treatment can be secured, and it is possible to prevent defects such as bending of the thin-piece forming region 31, and to perform appropriate treatment.

Since the thin-piece forming region 31 can be set in the central part of the sample piece Q regardless of the outer shape of each of the sample piece Q and the peripheral part 33, for example, even a part having a shape in which a treatment stripe pattern due to the curtain effect is likely to be generated is present at an end part of the sample piece Q, the thin-piece forming region 31 can be processed properly and easily without particularly restricting a relative incidence direction of the focused ion beam FIB with respect to the sample piece Q.

Further, by irradiating the focused ion beam FIB from the direction intersecting the irradiated face 34 of the sample piece Q in the treatment step, the etching treatment can be advanced in parallel to the irradiated face 34 at a desired depth from the irradiated face 34 in the thickness direction D of the sample piece Q. For example, even when a beam intensity distribution of the focused ion beam FIB has an appropriate distribution shape such as a Gaussian distribution, in which the irradiation axis U is maximum, the second cross section 42 parallel to the irradiated face 34 can be formed to reach the downstream end in the incident direction of the focused ion beam FIB in the thin-piece forming region 31 without requiring additional etching treatment.

Figure 5A:
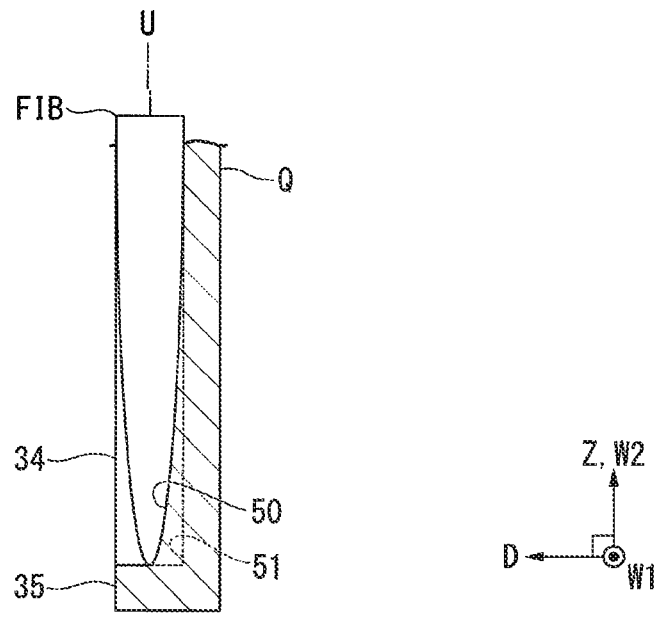
FIG. 5A is an enlarged cross-sectional view of a sample piece according to a comparative example of the embodiment of the present invention.

FIG. 5A is an enlarged cross-sectional view of a sample piece Q according to a comparative example of the embodiment of the present invention. For example, when the focused ion beam FIB is irradiated in parallel to the face 35 including the irradiated face 34 as in the comparative example shown in FIG. 5B, a treatment section 50 having a shape corresponding to the beam intensity distribution is formed at the downstream end in the incident direction of the focused ion beam FIB, additional etching treatment (tilt correction) may be required in which the incident direction of the focused ion beam FIB is changed in order to obtain a treatment cross section 51 parallel to the irradiated face 34.

Figure 5B:
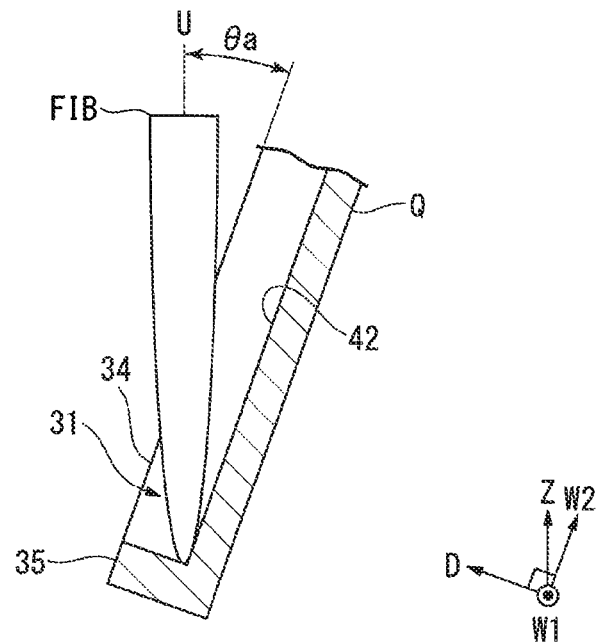
FIG. 5B is an enlarged cross-sectional view of the thin-piece forming region of the sample piece at the time of performing the treatment step of the thin-sample-piece fabricating method according to the embodiment of the present invention.

FIG. 5B is an enlarged cross-sectional view of the thin-piece forming region 31 of the sample piece Q at the time of performing the treatment step of the sample piece fabricating method according to the embodiment of the present invention. On the other hand, for example, as in the embodiment of the present invention shown in FIG. 5B, by irradiating the focused ion beam FIB at the appropriate tilt angle θa according to the shape of the beam intensity distribution of the focused ion beam FIB from the direction intersecting the irradiated face 34 of the sample piece Q, the second cross section 42 parallel to the irradiated face 34 can also be formed at the downstream end of the focused ion beam FIB in the incident direction without requiring additional etching treatment.

Still further, the computer 22 relatively rotates the irradiation axis U around the normal line N including the center C of the thin-piece forming region 31 among the normal lines of the irradiated face 34 in the range of the predetermined rotation angle, while maintaining the tilt angle θa at the predetermined angle. Thus, it can remove the treatment stripe pattern generated due to the curtain effect in the state where the rotation angle of the irradiation axis U is at an appropriate constant angle by etching treatment with the focused ion beam FIB in an incident direction different from the appropriate constant angle.

Further, by setting the outer shape of the thin-piece forming region 31 in a circular shape when viewed from the normal direction of the irradiated face 34, it is possible to prevent a part where load is concentrated, such as a corner part in a case where the outer shape of the thin-piece forming region 31 is set to a rectangular shape, and to prevent defects such as bending of the thin-piece forming region 31 during the etching treatment. Further, by setting the shape of the treatment frame 32 defining the thin-piece forming region 31 to a circular shape, it is possible to irradiate the thin-piece forming region 31 with the focused ion beam FIB without requiring to change the treatment frame 32 even when the irradiation axis U is relatively rotated around the normal line N.

Modifications of the above-described embodiments will be described below.

Figure 6:
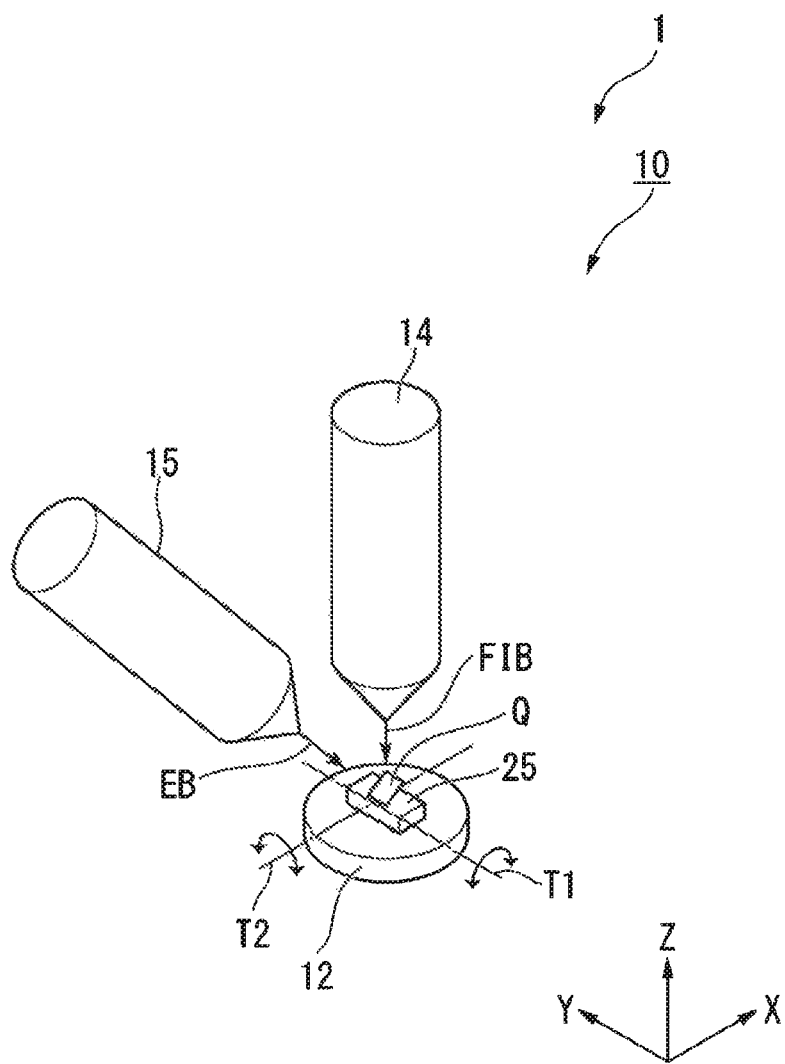
FIG. 6 is a configuration diagram of a charged particle beam device as an example of a thin-sample-piece fabricating apparatus according to a modification of the embodiment of the present invention.

In the embodiments described above, the charged particle beam device 10 may further include a biaxial driving mechanism. FIG. 6 is a configuration diagram of a charged particle beam device 10 as an example of a thin-sample-piece fabricating apparatus 1 according to a modification of the embodiment of the present invention. The charged particle beam device 10 includes a double tilt stage 25 disposed on the stage 12. The double tilt stage 25 is a biaxial driving mechanism and fixes the sample piece Q as the treatment target in the above-described treatment step.

The stage 12 is driven by the stage driving mechanism 13 that is a five-axis driving mechanism. For example, a tilt axis T1 of the stage driving mechanism 13 is set parallel to directions respectively orthogonal to the focused ion beam (FIB) of the focused-ion-beam irradiation optical system 14 and the electron beam (FB) of the electron-beam irradiation optical system 15. The stage driving mechanism 13 is configured to tilt the stage 12 around an axis of the tilt axis T1 so as to direct a cross section of the sample piece Q, which has been observed by the electron beam (EB), to the focused ion beam (FIB).

The double tilt stage 25 disposed on the stage 12 has two tilt axes orthogonal to each other. For example, the tilt axis T2 of the double tilt stage 25 is set parallel to directions respectively orthogonal to the tilt axis T1 of the stage driving mechanism 13 and the irradiation axis U of the focused ion beam (FIB). In the treatment step, the double tilt stage 25 tilts the sample piece Q around the axis of the tilt axis T2 in a state where the irradiated face 34 of the sample piece Q is directed to the irradiation axis of the electron beam (EB), so as to adjust the incident angle of the focused ion beam (FIB) with respect to the irradiated face 34. Accordingly, the observation image of the treatment face by the electron beam (EB) can be obtained during the etching treatment using the focused ion beam (FIB).

In the above-described embodiments, the thin-sample-piece fabricating apparatus 1 is the charged particle beam device 10. However, the present invention is not limited thereto.

For example, the thin-sample-piece fabricating apparatus 1 may be a particle beam device that irradiates a beam of uncharged particles instead of charged particles. In this case, it is possible to prevent the irradiation position of the particle beam from being displaced due to a leakage electric field or the like in the sample chamber 11.

For example, the thin-sample-piece fabricating apparatus 1 may be a focused ion beam device other than the charged particle beam device 10 for fabricating the sample piece Q from the sample S.

Incidentally, in the embodiments described above, the computer 22 may automatically execute at least a part of the operation of fabricating the thin sample. For example, the computer 22 may perform an automatic operation in a case where a plurality of sample pieces Q are subject to continuous and repeated operation of preparing the thin sample.

For example, in the above-described embodiment, in the initial setting step, the position and the shape of the thin-piece forming region 31 in the sample piece Q are input by the operator. However, the present invention is not limited thereto. For example, the computer 22 may automatically set the position and shape of the thin-piece forming region 31 in the sample piece Q. In this case, the computer 22 may extract the edge of the sample piece Q in the image data obtained by the irradiation of the charged particle beam, and automatically set a treatment frame 32 having a predetermined shape and size to a predetermined position based on the extracted edge.

In the above-described embodiments, the operation of fabricating the thin sample is performed with respect to the sample piece Q held in the sample piece holder P in advance. However, the present invention is not limited thereto.

For example, before the sample piece Q is taken out of the sample S by the needle 18, the sample piece Q formed on the sample S may be subject to the operation of fabricating the thin sample. In this case, setting of the treatment frame 32 and control of the position and the posture of the sample piece Q may be performed using position coordinates of the reference mark formed in the sample S in advance.

In the above-described embodiments, the outer shape of the treatment frame 32 is set to a circular shape when viewed from the thickness direction D of the sample piece Q, that is, the normal direction of the irradiated face 34 of the sample piece Q. However, the present invention is not limited thereto. The outer shape of the treatment frame 32 may be set to another shape such as an elliptical shape or a rectangular shape. In this case, at the time of performing the treatment step, a new treatment frame 32 may be reset depending on the rotation angle of the irradiation axis U around the normal line N of the irradiated face 34.

Incidentally, in the embodiments described above, a deposition film may be formed on the irradiated face 34 of the sample piece Q prior to the treatment step. In this case, the deposition target face 34 of the sample piece Q is irradiated with the electron beam or focused ion beam while being supplied with the deposition gas G by the gas supply unit 17, thereby forming a deposition film that covers the irradiated face 34. Thus, for example, even when unevenness occurs on the irradiated face 34 due to a difference in a sputtering rate of materials contained in the sample piece Q when the sample piece Q is formed prior to the treatment step, the irradiated face 34 can be smoothed by the deposition film, and the influence of the curtain effect can be reduced in the treatment step to be performed later.

The above-described embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the scope of the inventions. The accompanying claims and their equivalents are intended to cover such forms or modifications as would fall within the scope and spirit of the inventions.

The present application is based on a Japanese patent application (Japanese Patent Application No. 2018-034520) filed on Feb. 28, 2018, the contents of which are incorporated herein by reference.

REFERENCE SIGNS LIST

1 Thin-sample-piece fabricating apparatus
10 Charged particle beam device
11 Sample chamber
12 Stage (sample stage)
13 Stage driving mechanism (driving mechanism)
14 Focused-ion-beam irradiation optical system (particle-beam irradiation optical system)
15 Electron-beam irradiation optical system
16 Detector
17 Gas supply unit
18 Needle
19 Needle driving mechanism
20 Absorption current detector
21 Display device
22 Computer
23 Input device
31 Thin-piece forming region
31a Upstream part
311 Downstream part
32 Treatment frame
33 Peripheral part
34 Irradiated face
C Center
N Normal line
P Sample piece holder
Q Sample piece (sample)
R Secondary charged particle
S Sample
U Irradiation axis
S01 Initial setting step
S02 Treatment step

The invention claimed is:

1. A thin-sample-piece fabricating apparatus configured to fabricate a thin sample by etching a sample via sputtering, the thin-sample-piece fabricating apparatus comprising:
a particle-beam irradiation optical system configured to radiate a particle beam;
a sample stage configured to hold the sample;
a detector configured to detect secondary charged particles generated from the sample;
a driving mechanism configured to drive the sample stage, the driving mechanism being a five-axis driving mechanism comprising:
a moving mechanism configured to move the sample stage at least along an X axis, a Y axis, or a Z axis;
a tilting mechanism configured to tilt the sample stage around the X axis or the Y axis; and
a rotation mechanism configured to rotate the sample stage around the Z axis; and
a computer configured to:
define a treatment region of the sample in an image obtained by the detector; and
control the particle-beam irradiation optical system and the driving mechanism so as to irradiate the treatment region with the particle beam to etch the sample,
wherein the computer is configured to:
set on the sample a thin-piece forming region as the treatment region and a peripheral part surrounding an entire periphery of the thin-piece forming region;
control the driving mechanism to tilt the sample; and
radiate the particle beam from a direction intersecting an irradiated face of the sample at a tilt angle, so as to perform etching treatment to form a thickness of the thin-piece forming region to be thinner than a thickness of the peripheral part, the tilt angle being an intersection angle between the irradiated face of the sample and an irradiation axis of the particle beam, and
wherein in the performing of the etching treatment, the computer is configured to control the particle-beam irradiation optical system and the driving mechanism so as to scan the thin-piece forming region of the sample with the particle beam, while maintaining the tilt angle, to form:
a first cross section in an upstream part in an incident direction of the particle beam of the thin-piece forming region, the first cross section being formed to a predetermined depth in a thickness direction from the irradiated face of the sample, the first cross section being parallel to the irradiation axis of the particle beam; and
a second cross section in a downstream part in the incident direction of the particle beam of the thin-piece forming region, the second cross section being parallel to the irradiate face at the predetermined depth in the thickness direction of the sample.

2. The thin-sample-piece fabricating apparatus according to claim 1, wherein the computer is configured to:

receive an input related to an angle between the irradiated face and the irradiation axis of the particle beam and the thin-piece forming region;

set the thin-piece forming region on the sample based on the input;

control the driving mechanism based on the input so as to set the tilt angle between the irradiated face and the irradiation axis to a predetermined angle; and control the particle beam irradiating optical system and the driving mechanism to perform the etching treatment by scanning the thin-piece forming region with the particle beam while maintaining the predetermined angle.

3. The thin-sample-piece fabricating apparatus according to claim 2, wherein the computer is configured to:

receive an input related to a relative rotation angle of the irradiation axis around a normal line of the irradiated face; and control the particle-beam irradiation optical system and the driving mechanism to relatively rotate the irradiation axis around a normal line including a center of the thin-piece forming region among normal lines of the irradiated face in a predetermined range of rotation angle, while maintaining the predetermined angle based on the input.

4. The thin-sample-piece fabricating apparatus according to claim 1, wherein the particle-beam irradiation optical system is a focused-ion-beam irradiation optical system configured to radiate a focused ion beam, and wherein the computer is configured to radiate the focused ion beam from the direction intersecting the irradiated face of the sample at the tilt angle, the tilt angle being the intersection angle between the irradiated face of the sample and an irradiation axis of the focused ion beam.

5. The thin-sample-piece fabricating apparatus according to claim 1, wherein the tilt angle is set to about 20°.

6. A thin-sample-piece fabricating method comprising:

a setting step of setting on a sample a thin-piece forming region and a peripheral part surrounding an entire periphery of the thin-piece forming region;

a tilting step of tilting the sample; and a treatment step of radiating a particle beam from a direction intersecting an irradiated face of the sample at a tilt angle, so as to perform etching treatment via sputtering to form a thickness of the thin-piece forming region to be thinner than a thickness of the peripheral part, the tilt angle being an intersection angle between the irradiated face of the sample and an irradiation axis of the particle beam, wherein in the performing of the etching treatment, the method comprises controlling a particle beam irradiation optical system and a driving mechanism so as to scan the thin-piece forming region of the sample with the particle beam, while maintaining the tilt angle, to form:

a first cross section in an upstream part in an incident direction of the particle beam of the thin-piece forming region, the first cross section being formed to a predetermined depth in a thickness direction from the irradiated face of the sample, the first cross section being parallel to the irradiation axis of the particle beam; and a second cross section in a downstream part in the incident direction of the particle beam of the thin-piece forming region, the second cross section being parallel to the irradiate face at the predetermined depth in the thickness direction of the sample.

7. The thin-sample-piece fabricating method according to claim 6, wherein in the setting step, an outer shape of the thin-piece forming region is set to a circular shape when viewed from a normal direction of the irradiated face.

8. The thin-sample-piece fabricating method according to claim 7, wherein in the treatment step, the irradiation axis is relatively rotated around a normal line including a center of the thin-piece forming region within among normal lines of the irradiated face, while maintaining a constant angle between the irradiated face and the irradiation axis of the particle beam.

9. The thin-sample-piece fabricating method according to claim 6, wherein in the treatment step, the method comprises:

radiating a focused ion beam from the direction intersecting the irradiated face of the sample at the tilt angle.

10. The thin-sample-piece fabricating method according to claim 6, wherein the tilt angle is set to about 20°.

\* \* \* \* \*